(12) United States Patent
Kim et al.

(10) Patent No.: US 7,888,153 B2
(45) Date of Patent: Feb. 15, 2011

(54) METHOD OF MANUFACTURING VERTICAL LIGHT EMITTING DEVICE

(75) Inventors: Hyun-soo Kim, Yongin-si (KR); Kyoung-kook Kim, Yongin-si (KR); Hyung-kun Kim, Yongin-si (KR); Kwang-ki Choi, Yongin-si (KR); Jeong-wook Lee, Yongin-si (KR)

(73) Assignee: Samsung Electro-Mechanics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/805,132

(22) Filed: Jul. 14, 2010

(65) Prior Publication Data

US 2010/0279448 A1 Nov. 4, 2010

Related U.S. Application Data

(63) Continuation of application No. 11/882,259, filed on Jul. 31, 2007, now Pat. No. 7,781,246.

(30) Foreign Application Priority Data

Nov. 14, 2006 (KR) ...................... 10-2006-0112449

(51) Int. Cl.
*H01L 21/00* (2006.01)
(52) U.S. Cl. ............................. 438/43; 438/33; 257/99; 257/E33.005
(58) Field of Classification Search ................... 438/43; 257/99, E33.005
See application file for complete search history.

(56) References Cited

U.S. PATENT DOCUMENTS

| 2003/0189215 | A1 | 10/2003 | Lee et al. |
| 2005/0253161 | A1* | 11/2005 | Horio et al. ................. 257/100 |
| 2006/0071230 | A1* | 4/2006 | Lee et al. .................... 257/103 |
| 2006/0240585 | A1* | 10/2006 | Epler et al. .................. 438/22 |

* cited by examiner

*Primary Examiner*—Steven J Fulk
(74) *Attorney, Agent, or Firm*—Harness, Dickey & Pierce, P.L.C.

(57) ABSTRACT

Provided is a method of manufacturing a vertical light emitting device. The method of manufacturing the vertical light emitting device may include forming an emissive layer including a n-type semiconductor layer, an active layer, and a p-type semiconductor layer on a substrate, forming a first trench dividing the emissive layer into light emitting device units in which the emissive layer remains on the lower part of the first trench to a desired, or alternatively, a predetermined thickness, forming a passivation layer on the emissive layer, forming a p-type electrode on the p-type semiconductor layer of the emissive layer, forming a metal supporting layer on the passivation layer and the p-type electrode, removing the substrate, removing a remaining portion of the emissive layer when the surface of the emissive layer is exposed by removing the substrate, forming a n-type electrode on the n-type semiconductor layer of the emissive layer, and cutting the metal supporting layer to divide the emissive layer into the light emitting device units.

5 Claims, 16 Drawing Sheets

METHOD OF MANUFACTURING VERTICAL LIGHT EMITTING DEVICE

PRIORITY STATEMENT

This application is a continuation application of U.S. application Ser. No. 11/882,259, filed Jul. 31, 2007, now U.S. Pat No. 7,781,246 now allowed, which claims priority under 35 USC §119 to Korean Patent Application No. 2006-0112449, filed on Nov. 14, 2006, in the Korean Intellectual Property Office (KIPO), the contents of each of which are hereby incorporated by reference in their entirety.

BACKGROUND

1. Field

Example embodiments relate to a method of manufacturing a vertical light emitting device including a passivation layer formed on a sidewall of the vertical light emitting device which may prevent current leakage.

2. Description of Related Art

Light emitting devices (e.g., light emitting diodes (LEDs)) are widely used for transmitting, recording, and/or reading data in communication devices (e.g., optical communication devices), for example, compact disc players (CDPs), digital versatile disc players (DVDPs), or similar. Light emitting devices are also widely applied to components for large-sized electronic sign boards and liquid crystal display devices, for example, backlights. Currently, LEDs formed of groups III-V compound semiconductors are mainly used. FIG. 1 is a cross-sectional view illustrating the general structure of a conventional vertical light emitting device.

Referring to FIG. 1, the conventional vertical light emitting device includes a p-type electrode 11, a p-type semiconductor layer 12, an active layer 13, and a n-type semiconductor layer 14 which are sequentially formed on a metal supporting layer 10. The n-type electrode 15 is electrically connected to a part of the surface of the n-type semiconductor layer 14.

If the conventional vertical light emitting device is a GaN based light emitting device, the p-type semiconductor layer 12 is composed of a p-GaN compound semiconductor, the n-type semiconductor layer 14 is formed of a n-GaN compound semiconductor, and the active layer 13 is formed of an $In_xGa_{1-x}N$ compound semiconductor having a multi quantum well (MQW) structure. In addition, the p-type electrode 11 is formed of a metal (e.g., Ag, Au, Ni, Ru, or similar), and the n-type electrode 15 is formed of a metal (e.g., Ti/Al, or similar).

When a voltage is applied between the p-type electrode 11 and the n-type electrode 15, an electron is injected from the n-type electrode 15 to the n-type semiconductor layer 14, and a hole is injected from the p-type electrode 11 to the p-type semiconductor layer 12. When the electron and the hole are combined, light is emitted. The emitted light passes through the surface of the n-type semiconductor layer 14 and is radiated to the outside.

However, in a conventional vertical light emitting device having the above structure, current may leak through the sidewalls of the conventional vertical light emitting device. In order to prevent current leakage, a passivation layer formed of an insulating material is formed on the sidewalls of the conventional vertical light emitting device.

FIGS. 2A through 2G are cross-sectional views illustrating a method of manufacturing a conventional vertical light emitting device including a passivation layer.

Referring to FIG. 2A, emissive layers 30 are formed on a sapphire substrate 20. The emissive layers 30 are formed by sequentially forming a n-GaN semiconductor layer 31, an active layer 32, and a p-GaN semiconductor layer 33 on the sapphire substrate 20. Trenches 92 are then formed by etching the emissive layers 30. The trenches 92 each define the emissive layers 30 as a light emitting device unit. Because the trenches 92 are formed by etching the emissive layers 30 using the inductively coupled plasma-reactive ion etching (ICP-RIE) method, sides of the trenches 92 (e.g., sidewalls of the emissive layers 30) are formed to be inclined.

Referring to FIG. 2B, a p-type electrode 40 is formed on the p-GaN semiconductor 33 of the emissive layers 30. A post 94 is then formed by filling the inside of the trench 92 with a photoresist (PR).

Referring to FIG. 2C, a metal supporting layer 50 formed of Cu, Cr, or Ni is formed on the post 94 and the p-type electrode 40.

Referring to FIG. 2D, when the sapphire substrate 20 is separated and the post 94 is removed using a laser lift off (LLO) method, just the emissive layers 30 divided by the trenches 92 and the p-type electrodes 40 remain on the metal supporting layer 50.

Referring to FIG. 2E, a n-type electrode 60 is formed on the n-GaN semiconductor layer 31 of the emissive layers 30.

Referring to FIG. 2F, a passivation layer 70 is formed to protect the conventional vertical light emitting device and prevent current from leaking through the sidewalls of the conventional vertical light emitting device. The passivation layer 70 is formed by depositing an insulating material, for example, $SiO_2$, in the trenches 92 formed between the emissive layers 30 using a plasma enhanced chemical vapor deposition (PECVD) method.

Referring to FIG. 2G, the resulting structure of FIG. 2F is divided into light emitting device units using a sawing method or a laser scribing method. A light emitting device which includes the passivation layer 70 formed on the sidewalls of the emissive layers 30 is thereby manufactured.

The conventional manufacturing method has certain recognized problems. First, when a laser beam is irradiated on the emissive layers 30 formed of GaN during the LLO method, GaN is decomposed into gallium and nitrogen gas. A momentary shock wave occurs at an interface between each of the emissive layers 30 and the sapphire substrate 20 by the pressure of the generated nitrogen gas. The shock wave is concentrated toward the post 94 formed of a PR, which is softer than the other elements. The shock wave occurring at the post 94 accelerates the division between the post 94 and each of the emissive layers 30. Thus, a crack occurs on the emissive layers 30 placed below the interface between the p-type electrode 40 and the post 94 and further spreads inside the emissive layers 30.

FIGS. 3A and 3B are images of cracks occurring in an emissive layer when the LLO method is performed when the conventional vertical light emitting device is manufactured.

Referring to FIGS. 3A and 3B, cracks occurring inside an emissive layer can be seen. A light emitting device having cracks in the emissive layer cannot normally be used.

Second, because the sidewalls of the emissive layers 30 are reversely inclined when the passivation layer 70 is formed in the trench 92 between the emissive layers 30 as described above, it is difficult to uniformly deposit the passivation layer 70. Typically, when the passivation layer 70 is deposited using a PECVD method at a temperature of 300° or more, heat is generated. Thus, a connection defect occurs at the interface between the emissive layer 30 and each of the p-type electrode 40 and the n-type electrode 60, which are already formed, due to the heat. Accordingly, the characteristics of the light emitting device may deteriorate.

Third, referring to FIG. 2G, the passivation layer 70 is cut together with the metal supporting layer 50 using a sawing or a laser scribing method. As such, if the passivation layer 70 is damaged, almost or part of the passivation layer 70 may be detached from the sidewalls of the emissive layers 30.

SUMMARY

Example embodiments provide a method of manufacturing a vertical light emitting device which may reduce or prevent a crack from occurring when a laser lift off (LLO) method is performed and in which a passivation layer for reducing or preventing current leakage may be formed more easily and reliably.

According to example embodiments, a method of manufacturing a vertical light emitting device may include forming an emissive layer including a n-type semiconductor layer, an active layer, and a p-type semiconductor layer on a substrate, forming a first trench dividing the emissive layer into light emitting device units, in which the emissive layer remains on the lower part of the first trench to have a desired, or alternatively, a predetermined thickness, forming a passivation layer on the emissive layer, forming a p-type electrode on the p-type semiconductor layer of the emissive layer, forming a metal supporting layer on the passivation layer and the p-type electrode, removing the substrate, removing a remaining portion of the emissive layer when the surface of the emissive layer is exposed by removing the substrate, forming a n-type electrode on the n-type semiconductor layer of the emissive layer, and cutting the metal supporting layer to divide the emissive layer into the light emitting device units.

The forming of the passivation layer may include forming the passivation layer so as to fill the inside of the first trench, and the removing of the remaining portion may include exposing the passivation layer when the remaining portion of the emissive layer is removed. The forming of the passivation layer may further include forming a second trench in the exposed passivation layer.

The second trench may be formed so as to reach the surface of the metal supporting layer. The second trench may be formed by wet-etching the passivation layer.

The passivation layer may be formed to have a desired, or alternatively, a predetermined thickness on the emissive layer. The metal supporting layer, the metal supporting layer may be formed so as to fill the inside of the first trench. In the removing of the remaining portion, when the passivation layer contacting the remaining portion of the emissive layer is removed along with the remaining portion of the emissive layer, the metal supporting layer may be exposed.

The thickness of the passivation layer may be less than the thickness of the remaining portion of the emissive layer. The thickness of the remaining portion of the emissive layer may be about 1 µm or less, and the thickness of the passivation layer may be about 400 nm or less.

The emissive layer may further include an undoped semiconductor layer formed between the substrate and the p-type semiconductor layer, and the remaining portion of the emissive layer may be a part of the undoped semiconductor layer. In the removing of the remaining portion, when the surface of the emissive layer is etched, the undoped semiconductor layer may be removed.

The thickness of the remaining portion of the emissive layer may be less than the thickness of the undoped semiconductor layer. The thickness of the remaining portion of the emissive layer may be about 1 µm or less.

The substrate may be a sapphire substrate.

The first trench may be formed by etching the emissive layer using the ICP-RIE (inductive coupled plasma-reactive ion etching) method such that the sidewalls of the first trench may be inclined.

The passivation layer may be formed using the PECVD (plasma enhanced chemical vapor deposition) method. The passivation layer may be formed of one insulating material selected from the group consisting of $SiO_2$, $Si_3N_4$, and AlN.

The forming of the p-type electrode may include forming an opening by etching the passivation layer formed on the p-type semiconductor layer of the emissive layer, and forming the p-type electrode on the surface of the semiconductor layer exposed through the opening.

The metal supporting layer may be formed using one of an electroplating, an electroless plating, and a sputtering method.

In the removing of the substrate, the substrate may be separated from the emissive layer using a LLO (laser lift off) method. In the removing of the remaining portion, the surface of the emissive layer may be etched using the ICP-RIE method.

The metal supporting layer may be cut using a sawing or laser scribing method.

BRIEF DESCRIPTION OF THE DRAWINGS

Example embodiments will be more clearly understood from the following detailed description taken in conjunction with the accompanying drawings. FIGS. 1-6B represent non-limiting, example embodiments as described herein.

FIG. 1 is a cross-sectional view illustrating the general structure of a conventional vertical light emitting device;

FIGS. 6A and 6B are images of the states of an emissive layer after a LLO method is performed when a vertical light emitting device according to an example embodiment is manufactured.

DETAILED DESCRIPTION OF EXAMPLE EMBODIMENTS

Figure 1:
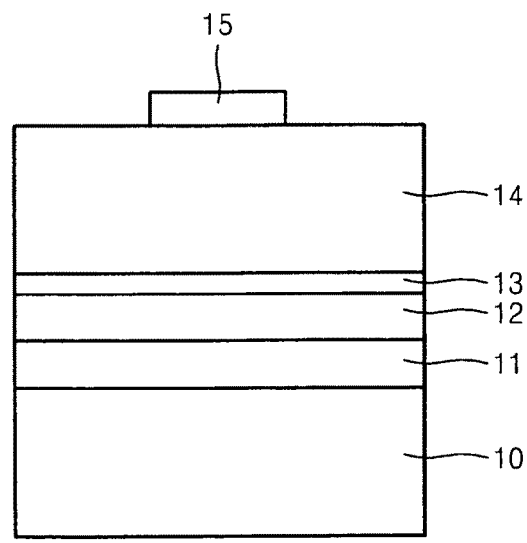
Figure 2A:
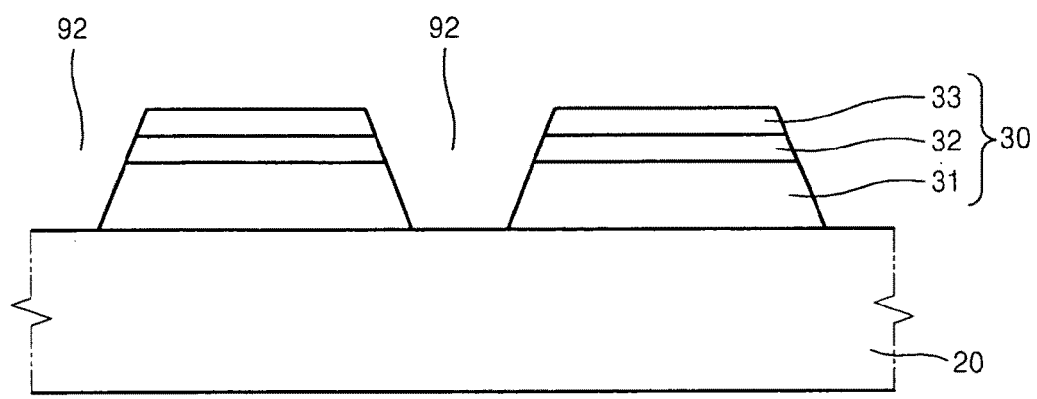
FIGS. 2A through 2G are cross-sectional views illustrating a method of manufacturing a conventional vertical light emitting device including a passivation layer.
Figure 2B:
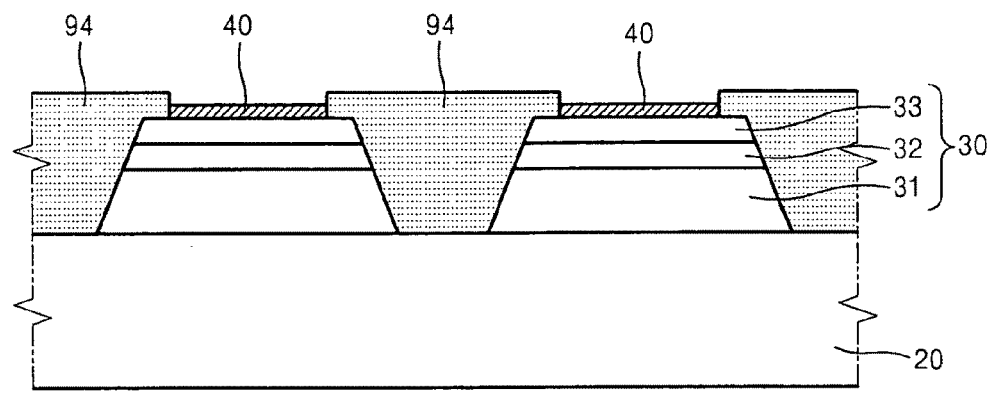
Figure 2C:
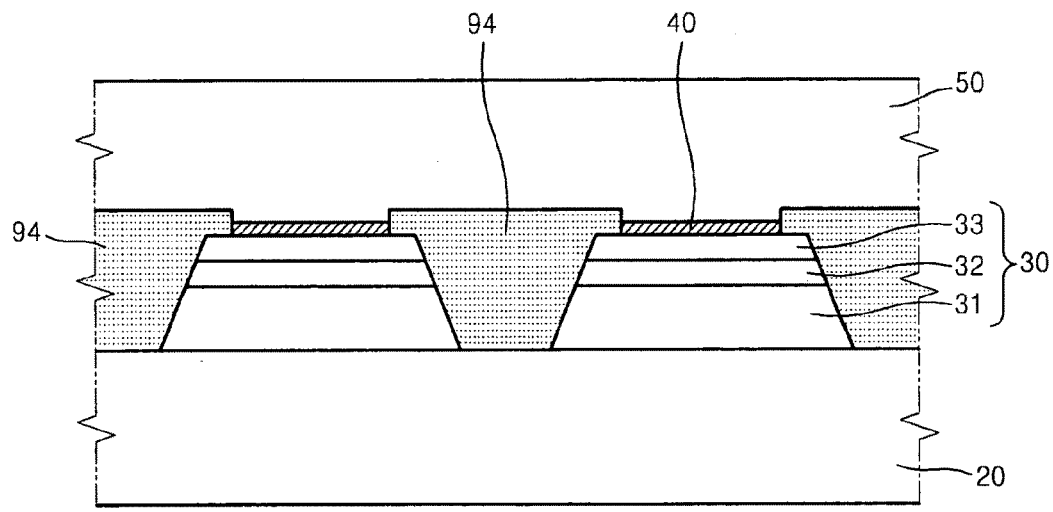
Figure 2D:
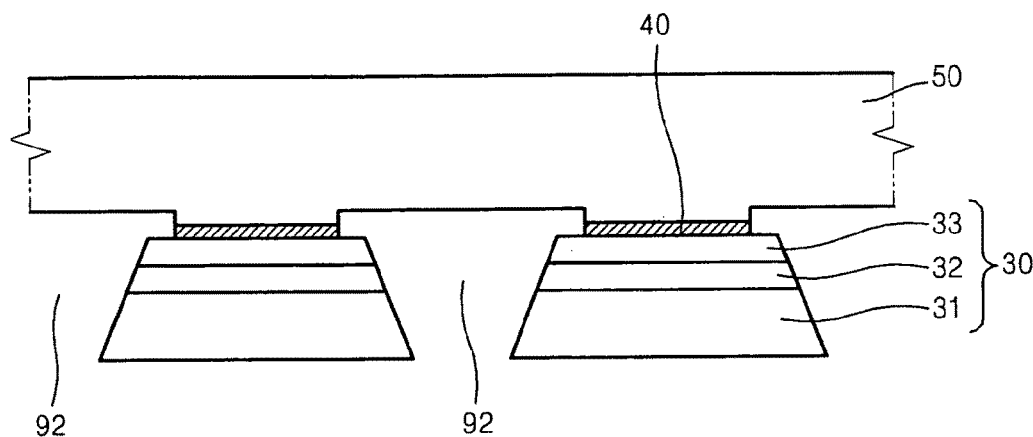
Figure 2E:
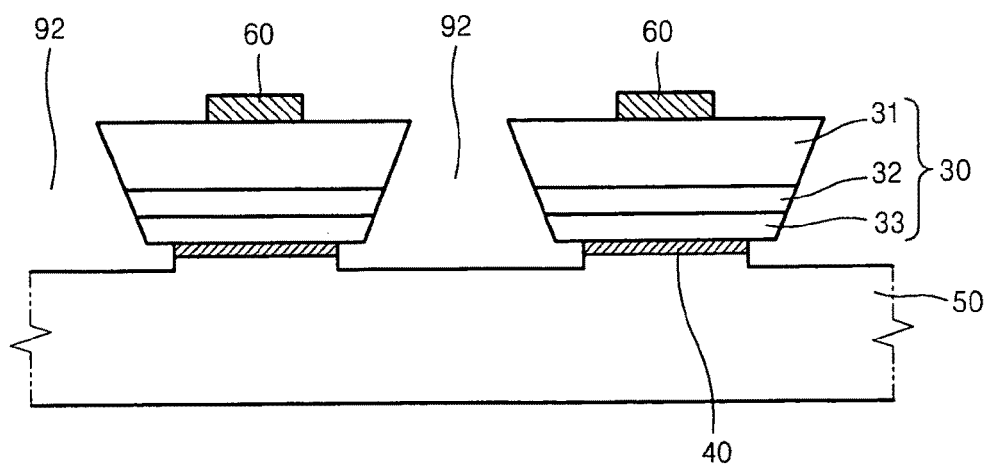
Figure 2F:
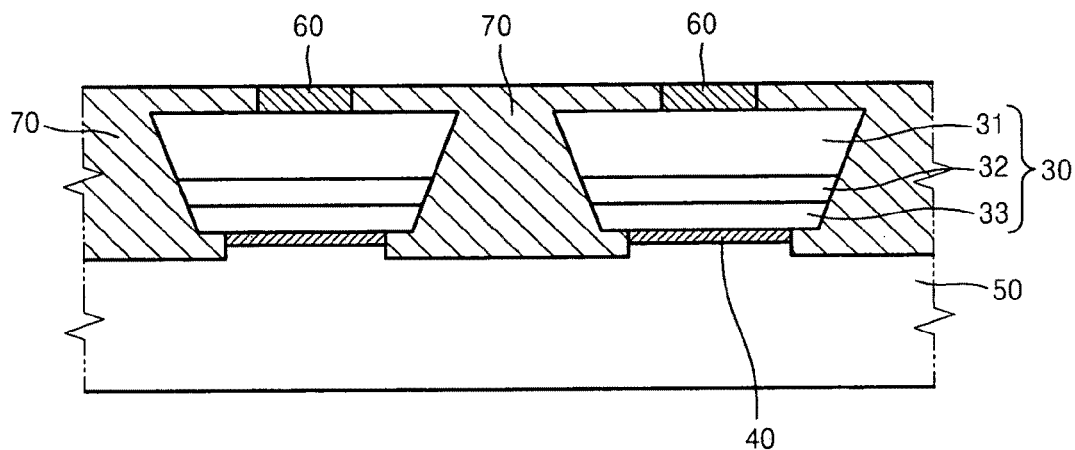
Figure 2G:
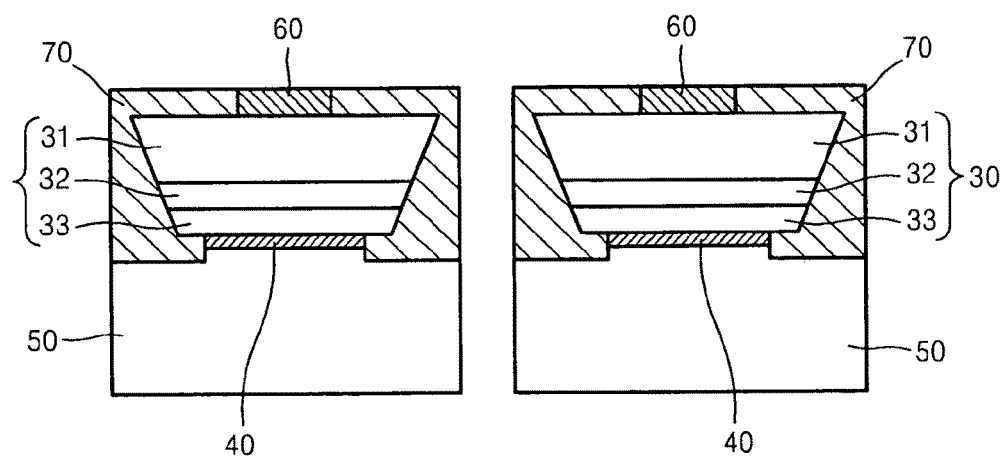
Figure 3A:
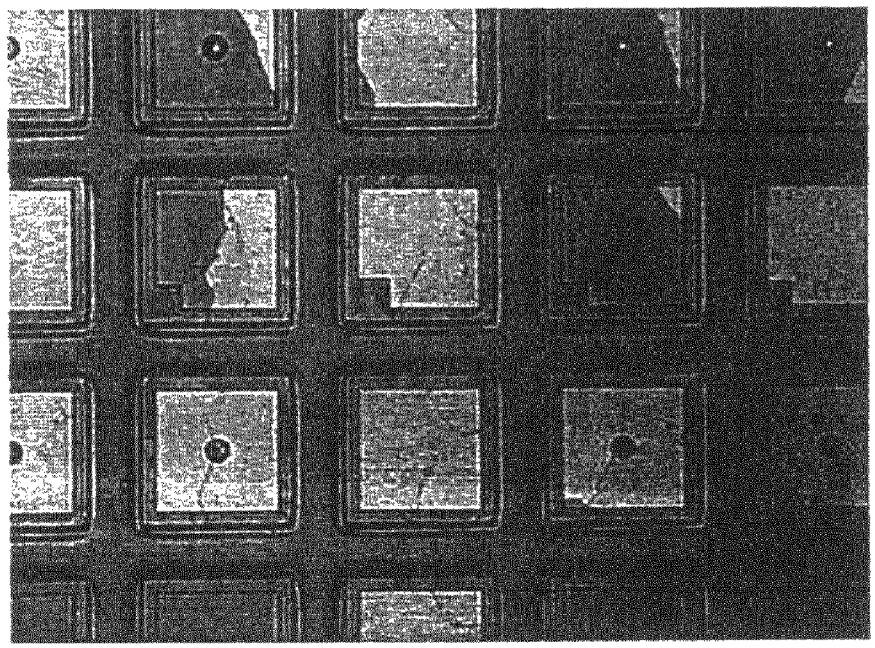
FIGS. 3A and 3B are images of cracks occurring when a laser lift off (LLO) method is performed when the conventional vertical light emitting device is manufactured.
Figure 3B:
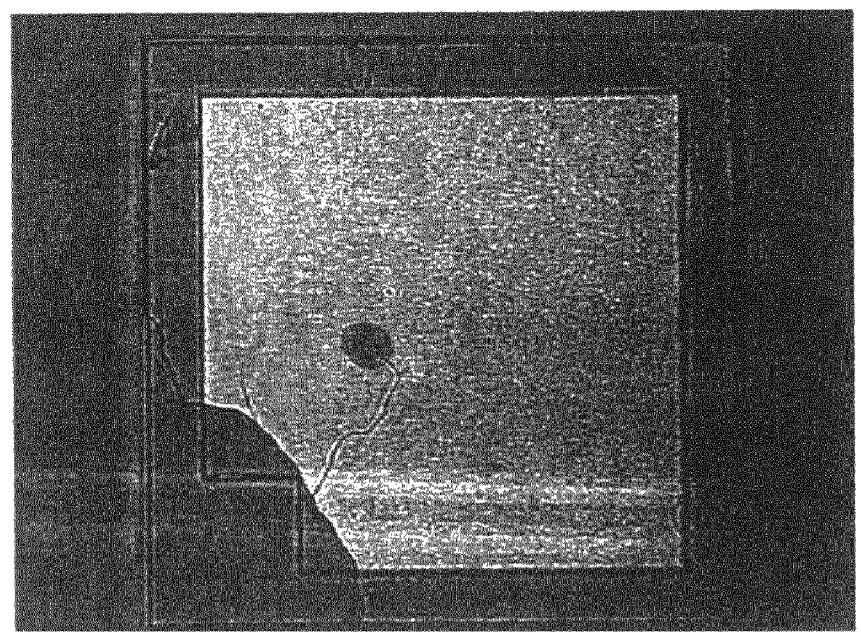

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 4A through 4J are cross-sectional views illustrating a method of manufacturing a vertical light emitting device according to an example embodiment.

Figure 4A:
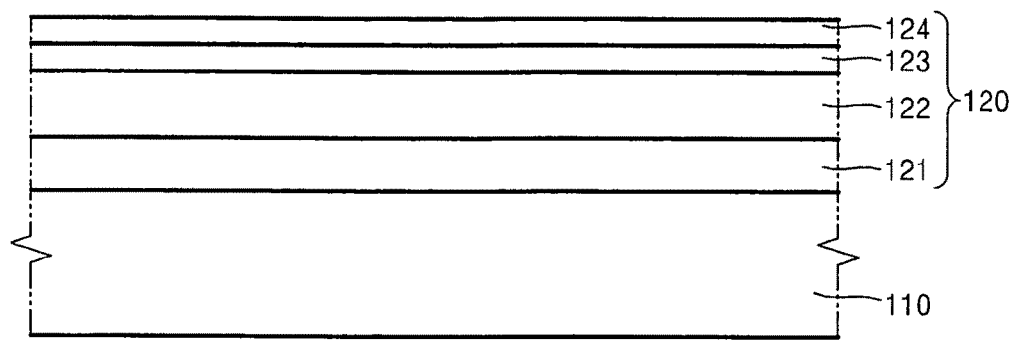
FIGS. 4A through 4J are cross-sectional views illustrating a method of manufacturing a vertical light emitting device according to an example embodiment.

Referring to FIG. 4A, an emissive layer 120 may be formed on a substrate 110. The substrate 110 may be a sapphire substrate. The emissive layer 120 may include a n-type semiconductor layer 122, an active layer 123, and a p-type semiconductor layer 124 which may be sequentially formed on the substrate 110. The n-type semiconductor layer 122 may be a n-type material layer formed of GaN based compounds (e.g., a n-GaN layer). The p-type semiconductor layer 124 may be a p-type material layer formed of GaN based compounds (e.g., a p-GaN layer) doped with p-type conductive impurities. The active layer 123 may be a material layer which emits light when carriers (e.g., electrons) and holes are combined therein, and may be formed to have a multi quantum well (MQW) structure of InGaN/GaN. The p-type semiconductor layer 122, the active layer 123, and the p-type semiconductor layer 124 may be formed to thicknesses of about 2 μm, 0.1 μm, and 0.2 μm, respectively.

The emissive layer 120 may further include an undoped semiconductor layer 121 which may be formed between the substrate 110 and the p-type semiconductor layer 122. The undoped semiconductor layer 121 may be an undoped material layer formed of GaN based compounds (e.g., a u-GaN layer). The undoped semiconductor layer 121 may be formed to a thickness of about 2 μm.

Figure 4B:
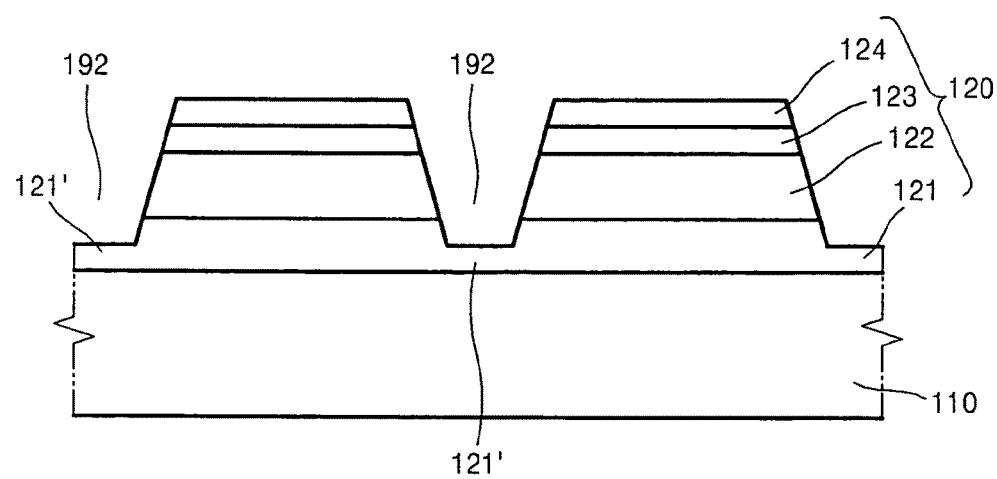

Referring to FIG. 4B, first trenches 192 may be formed by etching the emissive layer 120. The emissive layer 120 may be divided into light emitting device units by the first trenches 192. Parts of the emissive layer 120 remaining below the first trenches 192 may have a desired, or alternatively, a predetermined thickness.

The first trenches 192 may be formed by etching the emissive layer 120 using the inductively coupled plasma-reactive ion etching (ICP-RIE) method. Thus, the first trenches 192 may be formed such that sidewalls of the first trenches 192 are inclined.

A remaining portion 121' of the emissive layer 120 may be a part of the undoped semiconductor layer 121. The thickness of the remaining portion 121' of the emissive layer 120 may be less than that of the undoped semiconductor layer 121 such that the remaining portion 121' of the emissive layer 120 may be removed together with the undoped semiconductor layer 121 during the following operation as illustrated in FIG. 4G. As described above, the thickness of the undoped semiconductor layer 121 may be about 2 μm and the thickness of the remaining portion 121' of the emissive layer 120 may be less than about 1 μm.

Figure 4C:
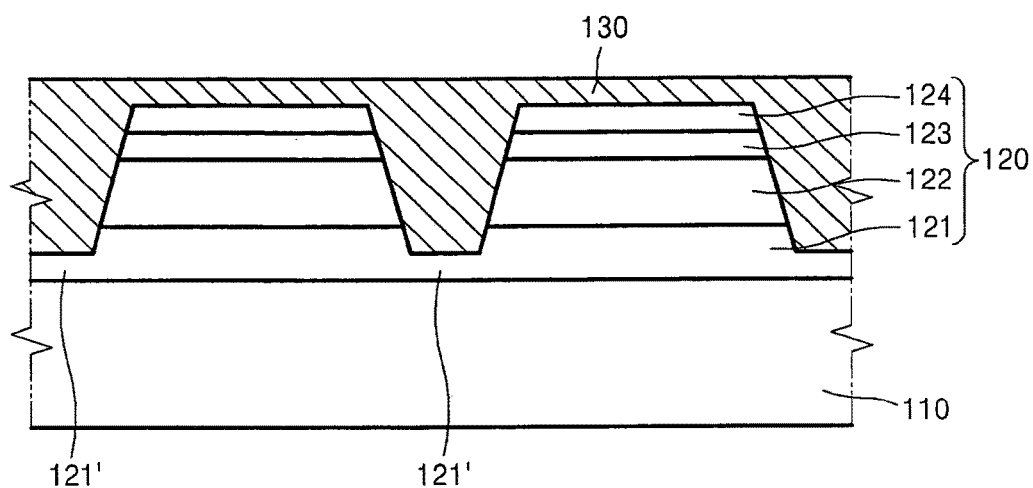

Referring to FIG. 4C, a passivation layer 130 may be formed on the emissive layer 120. The passivation layer 130 may be formed by depositing a predetermined or given insulating material, for example, $SiO_2$, on an entire surface of the emissive layer 120 using a plasma enhanced chemical vapor deposition (PECVD). The passivation layer 130 may be formed of $Si_3N_4$ or AlN.

The passivation layer 130 may be formed such that the first trench 192 is filled with the passivation layer 130 and the upper surface of the passivation layer 130 is higher than that of the emissive layer 120.

According to an example embodiment, the passivation layer 130 formed using the PECVD method may be formed before a p-type electrode 140 (FIG. 4D) and a n-type electrode 160 (FIG. 4I) are formed, as will be described later. Accordingly, the likelihood of an occurrence of a connection defect, which may occur at the interface between each of the p-type electrode 140 and the n-type electrode 160 and the emissive layer 120 due to heat generated during the PECVD method performed at a temperature of about 300° or more, may be reduced or prevented.

Because a deposition process for forming the passivation layer 130 may be performed when sidewalls of the emissive layer 120 are inclined, the deposition process of the passivation layer 130 may be performed more easily and reliably.

Figure 4D:
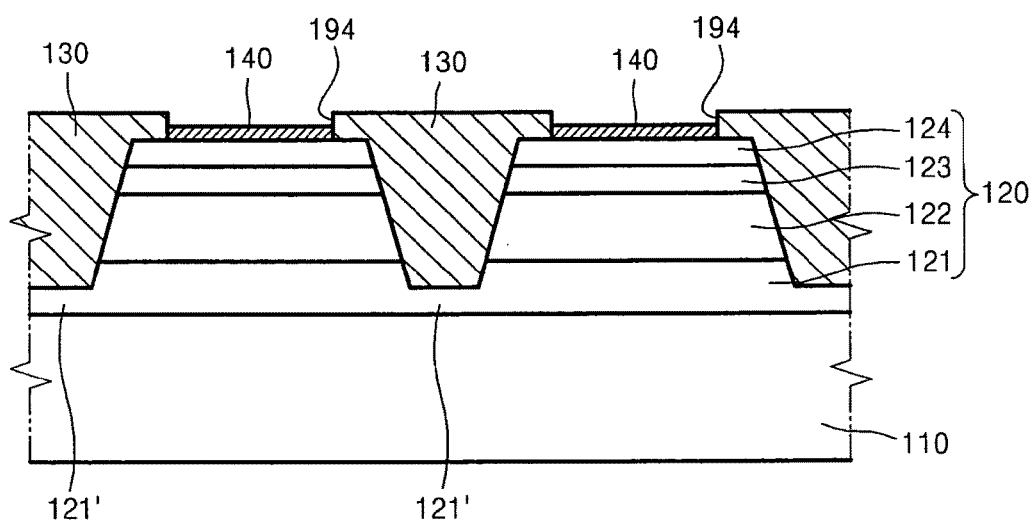

Referring to FIG. 4D, the p-type electrode 140 may be formed on the p-type semiconductor layer 124 of the emissive layer 120. A first opening 194 may be formed by etching the passivation layer 130 formed on the p-type semiconductor layer 124 of the emissive layer 120. The p-type electrode 140 may then be formed on the surface of the p-type semiconductor layer 124 exposed through the first opening 194. The p-type electrode 140 may be formed by depositing a metal (e.g., Ag, Al, Rh, Ir, Pt, or the similar) using a sputtering or an evaporation method.

Figure 4E:
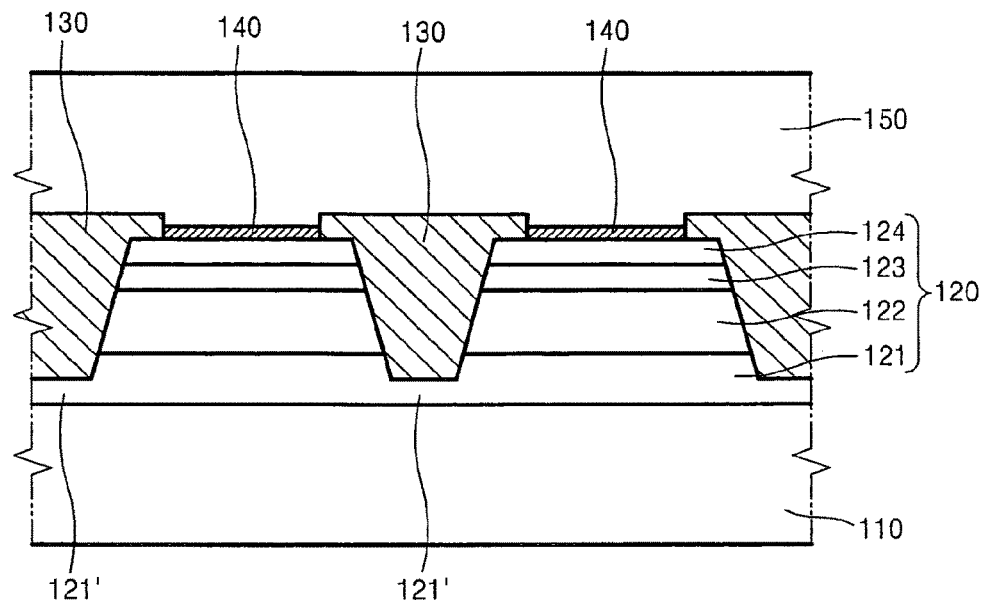

Referring to FIG. 4E, a metal supporting layer 150 may be formed on the passivation layer 130 and the p-type electrode 140. The metal supporting layer 150 may be formed of a metal (e.g., Cu, Cr, Ni, Ag, Au, Mo, Pd, W, Al, or similar) and may be formed using an electroplating, an electroless plating, or a sputtering method.

Figure 4F:
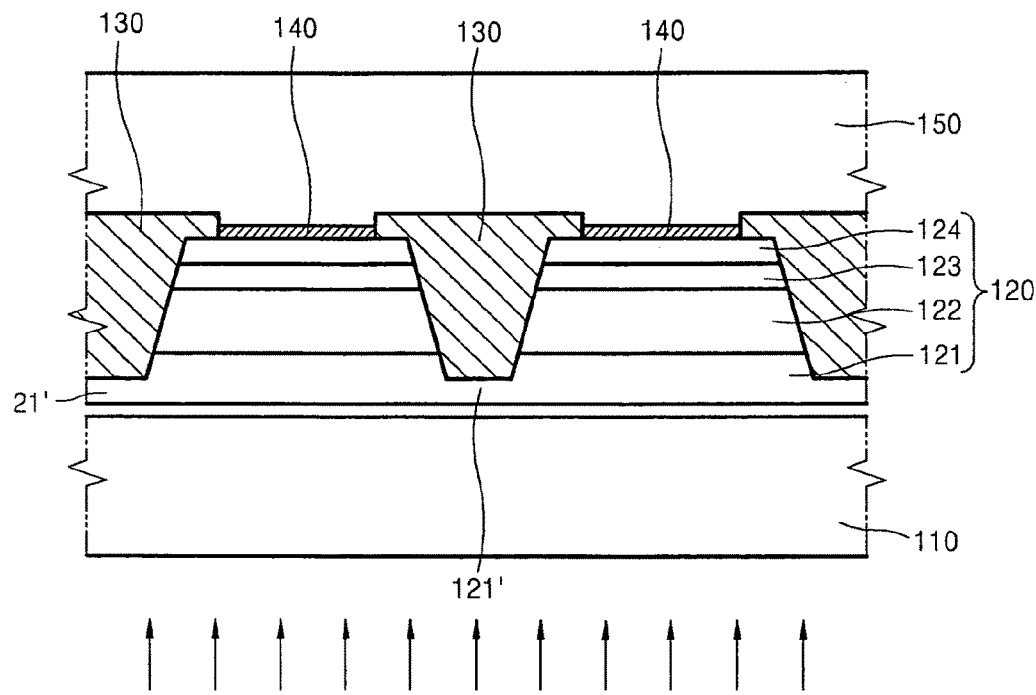
Figure 4G:
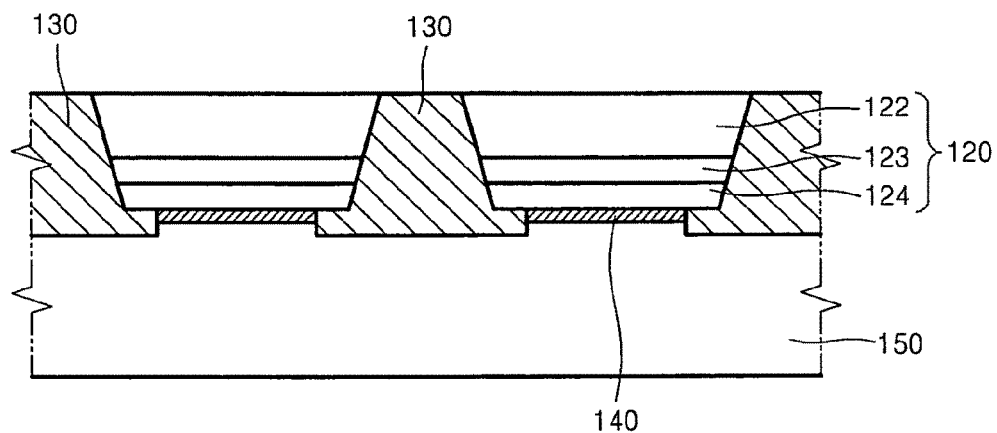

Referring to FIG. 4F, the substrate 110 may then be separated from the emissive layer 120 in order to be removed. The substrate 110 may be separated from the emissive layer 120 using a laser lift off (LLO) method. In particular, when a laser beam is irradiated on the substrate 110, heat may be generated at the interface between the substrate 110 and the emissive layer 120. When the surface of the emissive layer 120 formed of GaN decomposes and melts into gallium and nitrogen gas due to heat, the substrate 110 and the emissive layer 120 may be easily separated.

As described above, because the substrate 110 and the passivation layer 130 may be separated by the remaining portion 121' of the emissive layer 120, the passivation layer 130 may not be attached to the substrate 110 when the LLO method is performed.

When the first trench 192 is filled with a stronger material (e.g., the passivation layer 130) instead of a conventional soft material (e.g., a photoresist), the substrate 110 may be separated using the LLO method. Accordingly, when the substrate 110 is separated, a shock wave, which may be generated at the interface between the emissive layer 120 and the substrate 110 due to the pressure of nitrogen gas, may not be concentrated in the passivation layer 130 and may disperse uniformly. Accordingly, the likelihood of a crack occurring in the emissive layer 120 due to the concentration of the shock wave may be reduced or prevented.

Figure 6A:
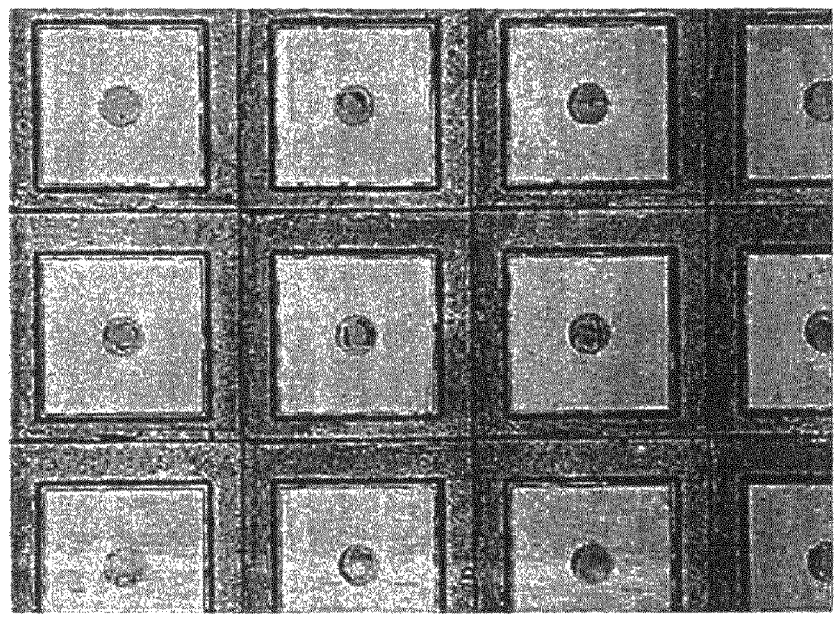
Figure 6B:
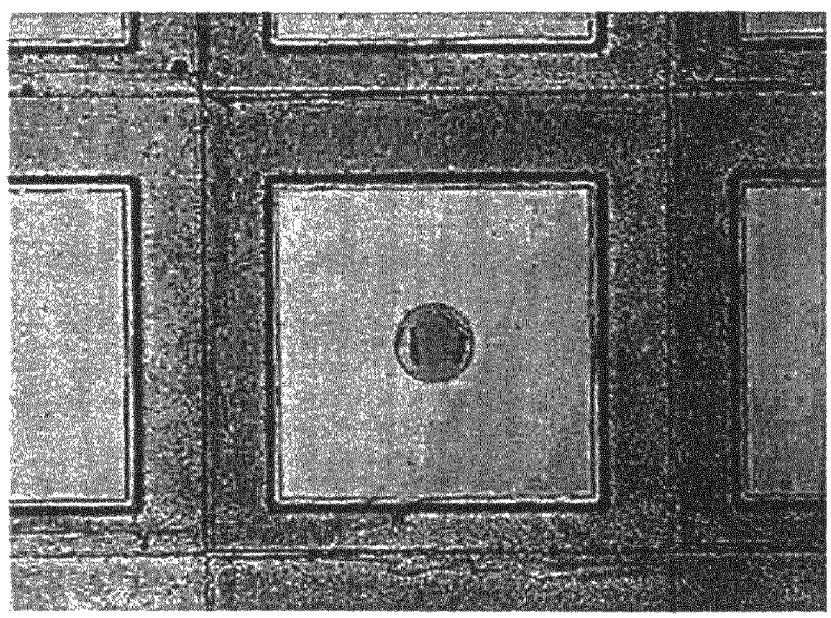

FIGS. 6A and 6B are images of the states of an emissive layer after a LLO method is performed when a vertical light emitting device is manufactured according to an example embodiment. As illustrated in FIGS. 6A and 6B, a crack may not occur at all in the emissive layer.

Referring to FIG. 4G, when the surface of the emissive layer 120, which may be exposed by removing the substrate 110, is etched, a remaining portion 121' of the emissive layer 120 may be removed. The surface of the emissive layer 120 may be etched using the ICP-RIE method. As described above, the undoped semiconductor layer 121 may be removed. The remaining portion 121' of the emissive layer 120 having a smaller thickness than that of the undoped semiconductor layer 121 may also be removed. Accordingly, the n-type semiconductor layer 122 of the emissive layer 120 may be exposed. The passivation layer 130, which fills the inside of the first trench 192, may also be exposed.

Figure 4H:
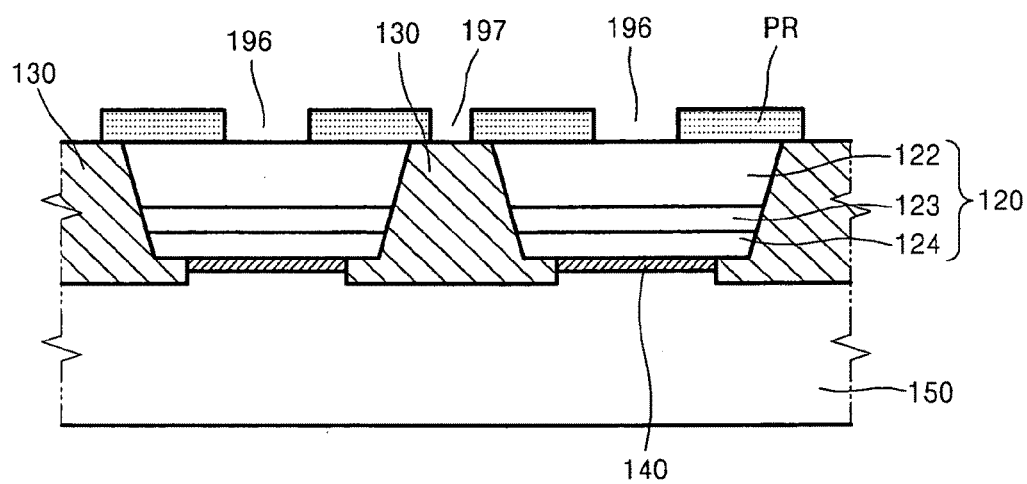

Referring to FIG. 4H, the exposed n-type semiconductor layer 122 and the exposed passivation layer 130 of the emissive layer 120 may be coated with a PR. The PR may be patterned to form a second opening 196 and a third opening 197 on the surface of the n-type semiconductor layer 122 and the surface of the passivation layer 130, respectively.

Figure 4I:
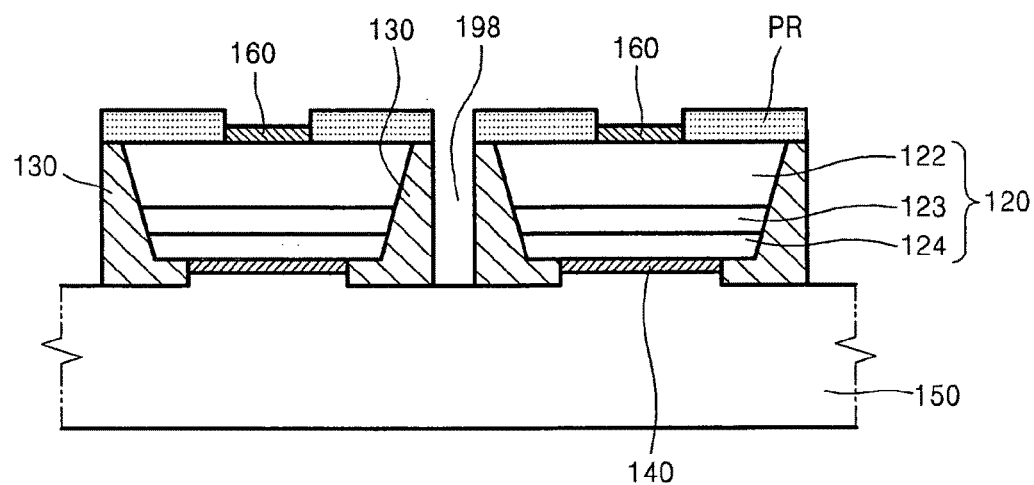

Referring to FIG. 4I, a second trench 198 may be formed in the exposed passivation layer 130. The second trench 198 may divide the emissive layer 120 and the passivation layer 130 into light emitting device units. The second trench 198 may be formed by wet-etching through the third opening 197 so as to reach the surface of the metal supporting layer 150. At this time, a hydrofluoric liquid may be used as an etchant. Simultaneously, the surface of the n-type semiconductor layer 122 of the emissive layer 120, which may be exposed through the second opening 196, may be cleaned by the hydrofluoric liquid.

A n-type electrode 160 may be formed on the n-type semiconductor layer 122 of the emissive layer 120. The n-type electrode 160 may be formed by depositing a metal (e.g., Ti/Al, Ti/Cu, Ti/Ni, or similar) using a sputtering or an evaporation method.

Figure 4J:
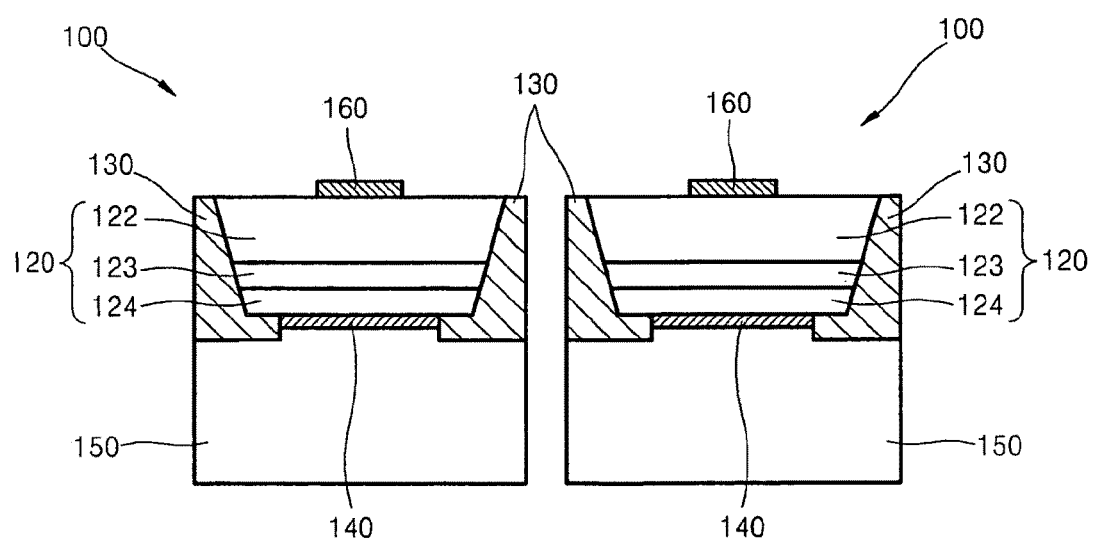

The resulting structure of FIG. 4I may be cut using a sawing or laser scribing method and divided into light emitting devices 100 as illustrated in FIG. 4J. In particular, the metal supporting layer 150 may be cut through the second trench 198. The p-type electrode 140, the emissive layer 120, and the n-type electrode 160 may then be sequentially formed on the metal supporting layer 150. The forming of the light emitting devices 100, which may be vertical type light emitting devices including the passivation layer 130 formed on sidewalls of the emissive layer 120, may thereby be completed.

As described above, according to an example embodiment, because only the metal supporting layer 150 may be cut when the sawing or laser scribing method is performed, the passivation layer 130 may not be damaged. Accordingly, the passivation layer 130 may be maintained on the sidewall of the emissive layer 120 to have a proper shape.

FIGS. 5A through 5I are cross-sectional views illustrating a method of manufacturing a vertical light emitting device according to an example embodiment.

Figure 5A:
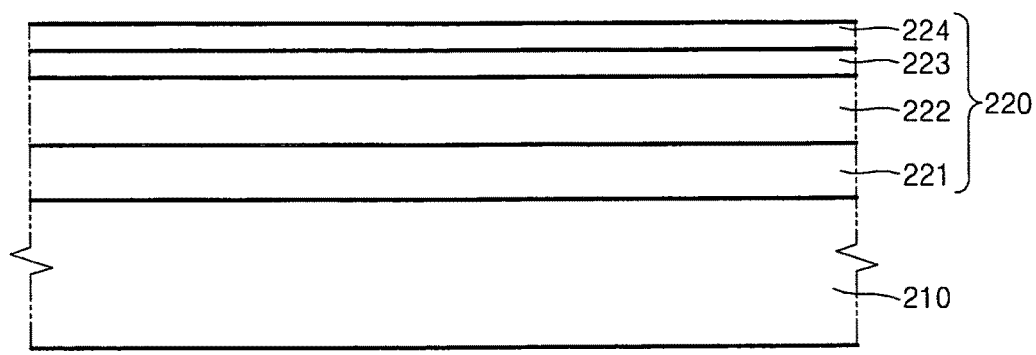
FIGS. 5A through 5I are cross-sectional views illustrating a method of manufacturing a vertical light emitting device according to an example embodiment.

Referring to FIG. 5A, an emissive layer 220 may be formed on a substrate 210. The substrate 210 may be a sapphire substrate. The emissive layer 220 may include a n-type semiconductor layer 222, an active layer 223, and a p-type semiconductor layer 224. The emissive layer 220 may further include an undoped semiconductor layer 221 formed between the substrate 210 and the n-type semiconductor layer 222.

Figure 5B:
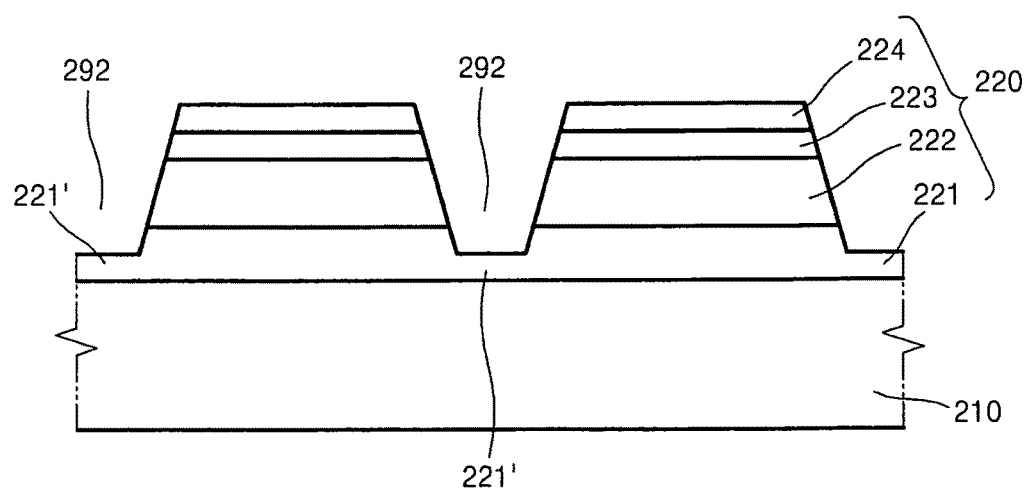

Referring to FIG. 5B, a first trench 292 may be formed by etching the emissive layer 220 using the ICP-RIE method. The emissive layer 220 may be divided into light emitting device units by the first trench 292. The emissive layer 220 may remain on the lower part of the first trench 292 having a predetermined or given thickness. A remaining portion 221' of the emissive layer 220 may be a part of the undoped semiconductor layer 221.

Operations described with respect to FIGS. 5A and 5B may be similar to the operations described with respect to FIGS. 4A and 4B, respectively, and thus a detailed description of the operations described in FIGS. 5A and 5B will be omitted.

Figure 5C:
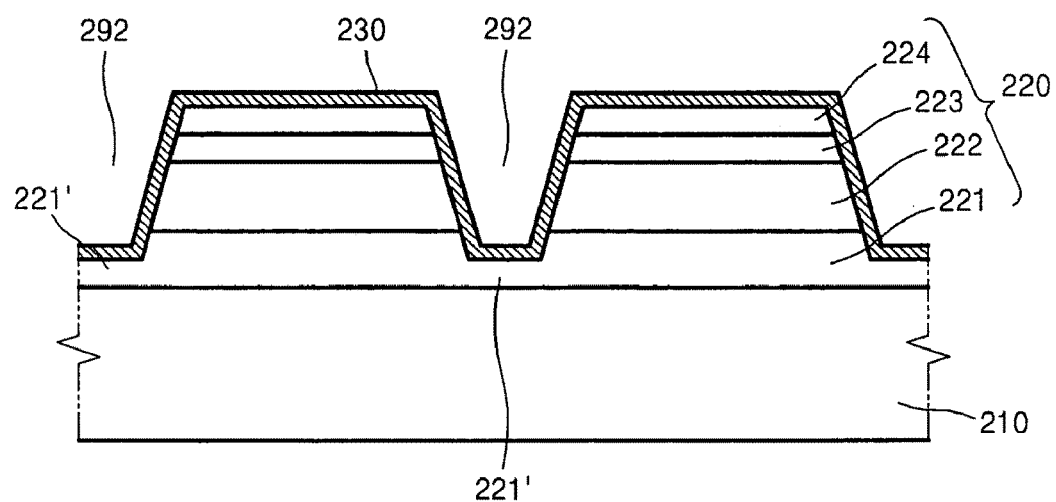

Referring to FIG. 5C, a passivation layer 230 may be formed on the emissive layer 220. The passivation layer 230 may be formed by depositing an insulating material (e.g., SiO$_2$, Si$_3$N$_4$, or AlN) on the surface of the emissive layer 220 using the PECVD method.

The passivation layer 230 may be formed on the surface of the emissive layer 220 to have a desired, or alternatively, a predetermined thickness. The thickness of the passivation layer 230 may be less than that of the remaining portion 221' of the emissive layer 220. For example, the thickness of the remaining portion 221' of the emissive layer 220 may be about 1 µm or less, and the thickness of the passivation layer 230 may be about 400 nm or less. Accordingly, when the semiconductor layer 221 is removed, the remaining portion 221' of the undoped semiconductor layer 221 may be removed along with the passivation layer 230 contacting with the remaining portion 221' of the emissive layer 220 as described in the following operation of FIG. 5G.

As described above, the passivation layer 230 may be formed before a p-type electrode (240 of FIG. 5D) and a n-type electrode (260 of FIG. 4H) are formed. In addition, when the sidewalls of the emissive layer 220 are inclined, the deposition process of the passivation layer 230 may be performed. Thus, the method according to example embodiments may have similar advantages to the method illustrated in FIGS. 4A through 4J.

Figure 5D:
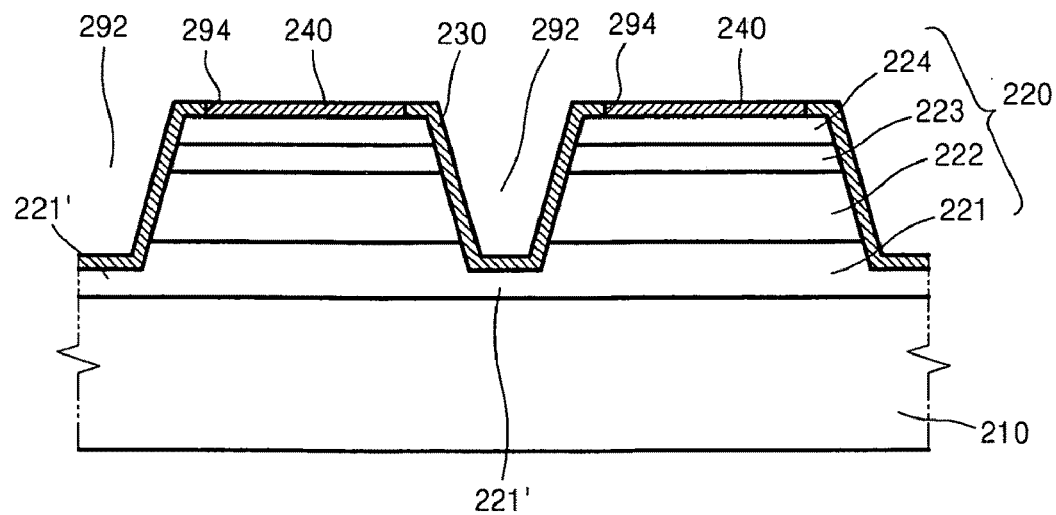

Referring to FIG. 5D, the p-type electrode 240 may be formed on the p-type semiconductor layer 224 of the emissive layer 220. A first opening 294 may be formed by etching the passivation layer 230 formed on the p-type semiconductor layer 224 of the emissive layer 220. The p-type electrode 240 may then be formed on the surface of the p-type semiconductor layer 224 through the first opening 294. The p-type electrode 240 may be formed by depositing a metal (e.g., Ag, Al, Rh, Ir, Pt, or similar) using a sputtering or an evaporation method.

Figure 5E:
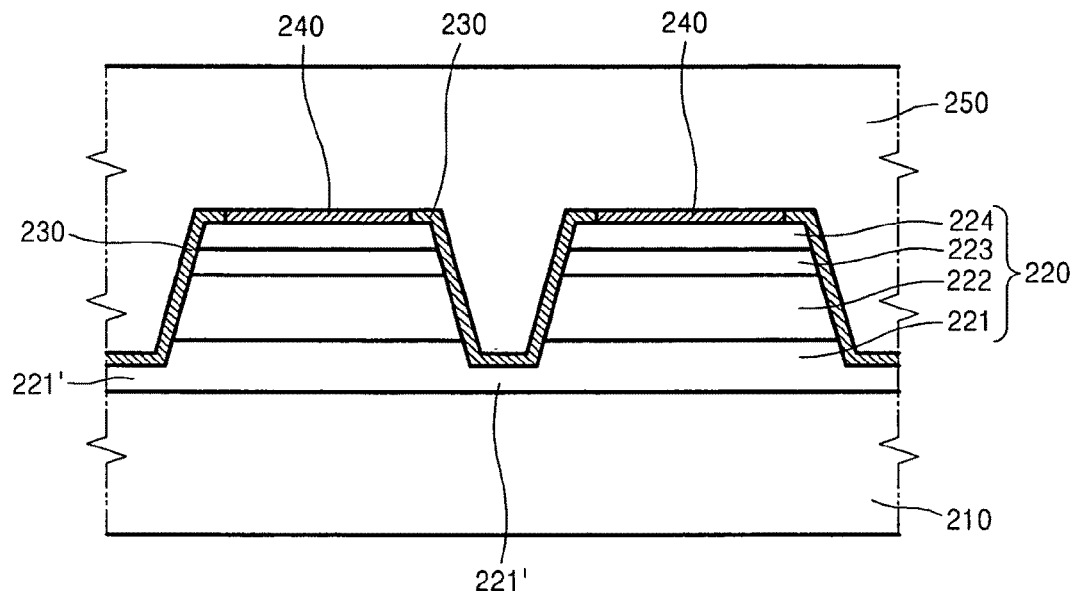

Referring to FIG. 5E, a metal supporting layer 250 may be formed on the passivation layer 230 and the p-type electrode 240. The metal supporting layer 250 may be formed to fill the inside of the first trench 292. The metal supporting layer 250 may be formed of a metal (e.g., Cu, Cr, Ni, Ag, Au, Mo, Pd, W, Al, or similar) and may be formed using an electroplating, an electroless plating, or a sputtering method.

Figure 5F:
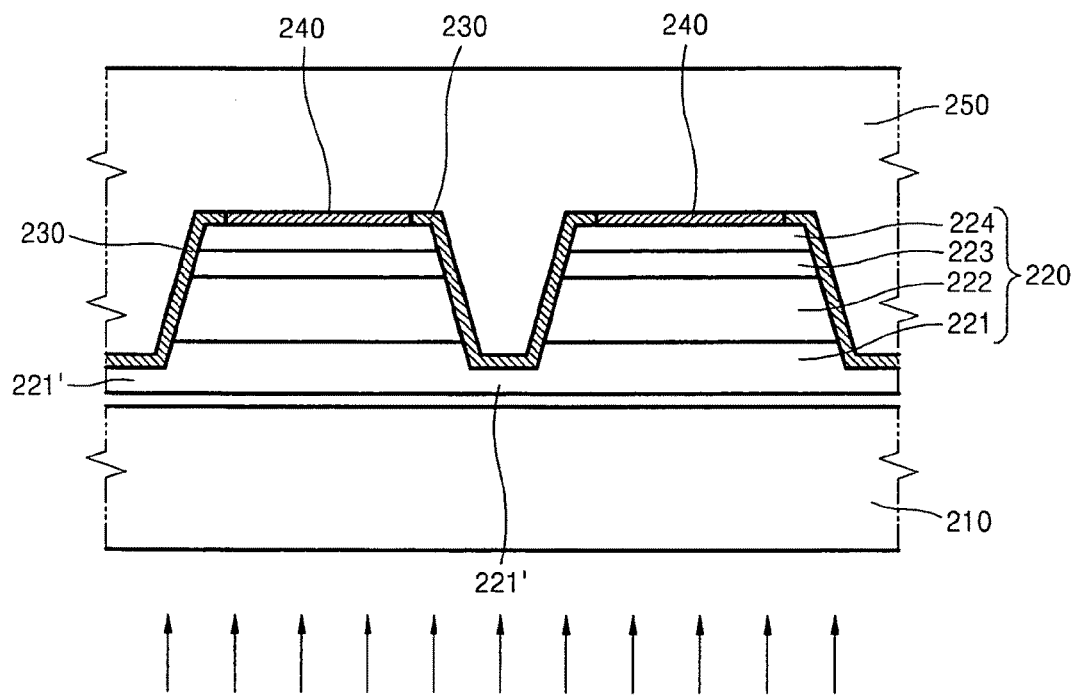

Referring to FIG. 5F, the substrate 210 may be separated from the emissive layer 220 in order to be removed. The substrate 210 may be separated from the emissive layer 220 using a LLO method.

As described above, because the substrate 210 and the passivation layer 230 may be separated by the remaining portion 221' of the emissive layer 220, the passivation layer 230 may not be attached to the substrate 210 when the LLO method is performed. In addition, because the first trench 292 may be filled with a stronger material (e.g., the metal supporting layer 250), a shock wave, which may be generated when the substrate 210 is separated during the LLO method, may disperse uniformly. Accordingly, the likelihood of an occurrence of a crack occurring in the emissive layer 220 due to the concentration of the shock wave may be reduced or prevented.

Figure 5G:
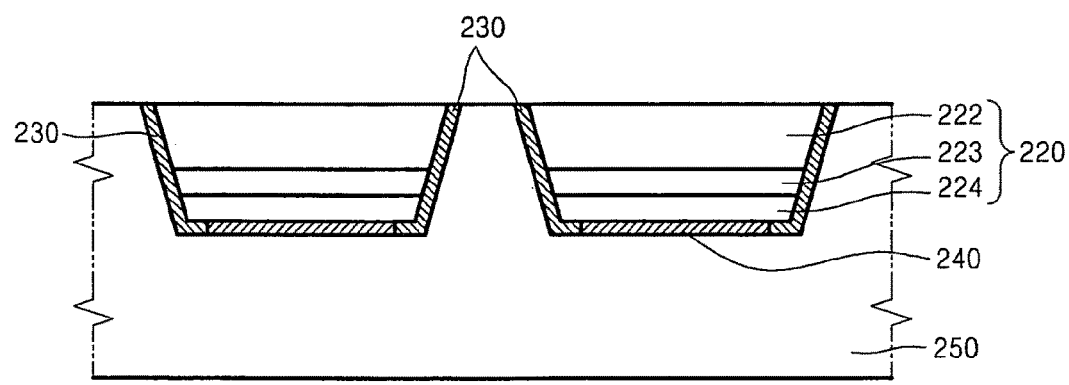

Referring to FIG. 5G, when the surface of the emissive layer 220, which may be exposed by removing the substrate 210, is etched, the passivation layer 230 contacting with the remaining portion 221' of the emissive layer 220 may be removed along with the remaining portion 221' of the emissive layer 220. The surface of the emissive layer 220 may be etched using the ICP-RIE method.

When the undoped semiconductor layer 221 is removed, the passivation layer 230 contacting the remaining portion 221' of the emissive layer 220 may be removed along with the remaining portion 221' of the emissive layer 220. Because the undoped semiconductor layer 221 and the remaining portion 221' may be formed of GaN and the passivation layer 230 may be formed of an insulating material (e.g., SiO$_2$), the undoped semiconductor layer 221, the remaining portion 221', and the passivation layer 230 may be etched at different etch rates. Because an element formed of SiO$_2$ may be etched more slowly than an element formed of GaN, although the undoped semiconductor layer 221 and the remaining portion 221' may be etched, the passivation layer 230 may not be etched. To reduce or prevent the likelihood of the passivation layer 230 not being etched, the thicknesses of each layer may be determined by the following equation, according to the etch rate of each layer.

$$T_S < \left(\frac{ER_S}{ER_G}\right) \times T_G \qquad (1)$$

In Equation 1, $T_S$ is the thickness of the passivation layer 230, $T_G$ is the thickness of the undoped semiconductor layer 221, $ER_S$ is the etch rate of the passivation layer 230, and $ER_G$ is the etch rate of the undoped semiconductor layer 221.

As described above, when the thickness of the undoped semiconductor layer 221 formed of GaN is about 2 µm, and the thickness of the remaining portion 221' of the emissive layer 220 is about 1 µm, the thickness of the passivation layer 230 formed of SiO$_2$ may be about 400 nm or less according to Equation 1.

The thickness of each layer may be determined as described above. When the undoped semiconductor layer 221 is removed by etching, the remaining portion 221' of the emissive layer 220 and the passivation layer 230 contacting the remaining portion 221' of the emissive layer 220 may also be removed. Accordingly, the n-type semiconductor layer 222 of the emissive layer 220 may be exposed and the metal supporting layer 250 filling the inside of the first trench 292 may also be exposed.

Figure 5H:
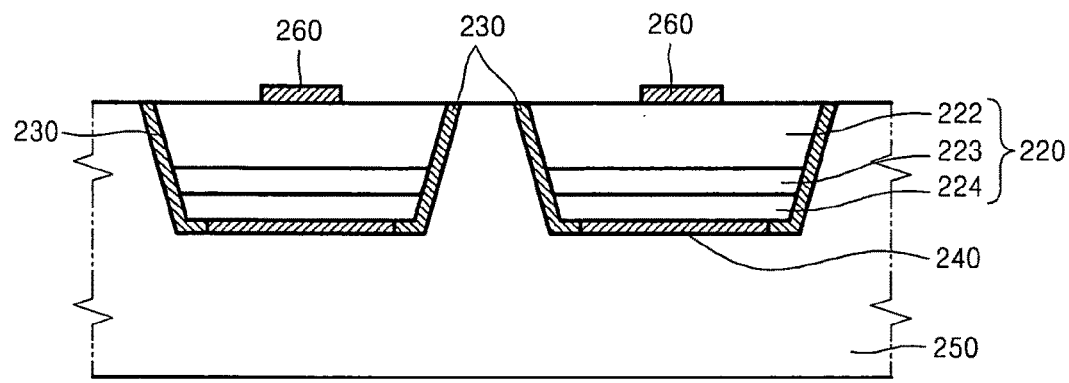

Referring to FIG. 5H, a n-type electrode 260 may be formed on the exposed surface of the p-type semiconductor layer 222 of the emissive layer 220. The n-type electrode 260 may be formed by depositing a metal (e.g., Ti/Al, Ti/Cu, Ti/Ni, or similar) using a sputtering or an evaporation method.

Figure 5I:
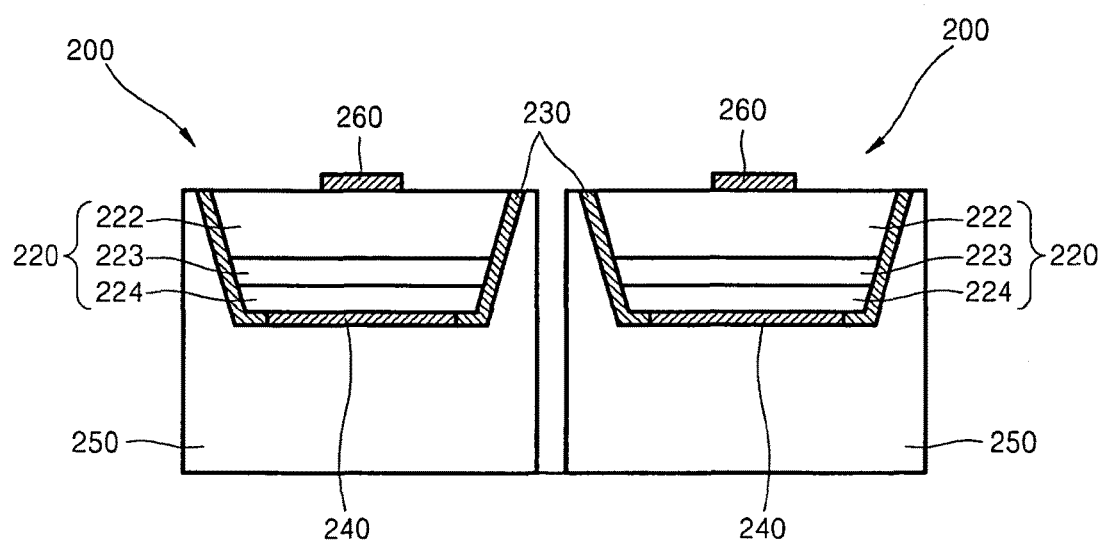

The resulting structure of FIG. 5H may be cut using a sawing or a laser scribing method to be divided into light emitting devices 200 as illustrated in FIG. 5I. In particular, the metal supporting layer 250 may be vertically cut between the emissive layers 220. The p-type electrode 240, the emissive layer 220, and the n-type electrode 260 may then be sequentially formed on the metal supporting layer 250. The passivation layer 230 may be formed on sidewalls of the emissive layer 220. Thus, forming of the light emitting devices 200, which may be vertical type light emitting devices and may include the metal supporting layer 250 surrounding the passivation layer 230, may thereby be completed.

As described above, according to example embodiments, because only the metal supporting layer 250 may be cut using a sawing or a laser scribing method, the passivation layer 230 may not be damaged. Accordingly, the passivation layer 230 may be maintained on the sidewalls of the emissive layer 220 to have a proper shape and may be protected by the metal supporting layer 250 surrounding the passivation layer 230.

According to example embodiments, because the passivation layer may be formed before the p-type electrode and the n-type electrode are formed; the likelihood of an occurrence of a connection defect, which may occur at the interface between each of the p-type electrode and the n-type electrode and the emissive layer due to heat generated when the PECVD method is used, may be reduced or prevented.

Also, because a deposition process for forming the passivation layer may be performed when sidewalls of the emissive layer are inclined, the deposition process may be performed more easily and reliably.

Further, because the substrate and the passivation layer may be separated by the remaining portion of the emissive layer, the passivation layer may not be attached to the substrate when the LLO method is used.

According to example embodiments, because a trench formed between emissive layers may be filled with stronger material (e.g., a passivation layer or a metal supporting layer), a shock wave, which may be generated when the substrate is separated when the LLO method is performed, may disperse uniformly. Accordingly, the likelihood of an occurrence of a crack occurring in the emissive layer due to the concentration of the shock wave may be reduced or prevented.

Also, because only the metal supporting layer may be cut using a sawing or a laser scribing method, the passivation layer may not be damaged. Thus, the passivation layer may be maintained on the sidewalls of the emissive layer to have a proper shape. Accordingly, the passivation layer for reducing or preventing a leakage current may be formed more easily and reliably.

Further, because the manufacturing method of example embodiments may be simper than the conventional manufacturing method, manufacturing costs may be reduced.

The foregoing is illustrative of example embodiments and is not to be construed as limiting thereof. Although example embodiments have been described, those skilled in the art will readily appreciate that many modifications may be possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of manufacturing a vertical light emitting device, the method comprising:
    forming an emissive layer including a n-type semiconductor layer, an active layer, and a p-type semiconductor layer on a substrate;
    forming a first trench dividing the emissive layer into a plurality of light emitting device units, the emissive layer remaining on a lower part of the first trench;
    forming a passivation layer on the emissive layer so as to fill an inside of the first trench;
    forming a p-type electrode on the p-type semiconductor layer of the emissive layer;
    forming a metal supporting layer on the passivation layer and the p-type electrode;
    removing the substrate so as to expose a surface of the emissive layer;
    removing a remaining portion of the emissive layer when the surface of the emissive layer is exposed by removing the substrate;
    forming a n-type electrode on the n-type semiconductor layer of the emissive layer; and
    cutting the metal supporting layer to divide the emissive layer into the light emitting device units.
    wherein the removing of the remaining portion of the emissive layer includes exposing the passivation layer and the forming of the passivation layer further includes forming a second trench in the exposed passivation layer; and
    wherein the passivation layer is formed to a thickness less than a thickness of the remaining portion of the emissive layer, the metal supporting layer is formed so as to fill the inside of the first trench, the passivation layer contacting the remaining portion of the emissive layer is removed along with the remaining portion of the emissive layer, and the metal supporting layer is exposed when the passivation layer contacting the remaining portion of the emissive layer is removed.

2. The method of claim 1, wherein the second trench is formed so as to reach a surface of the metal supporting layer.

3. The method of claim 1, wherein the thickness of the remaining portion of the emissive layer is about 1 µm or less and the thickness of the passivation layer is about 400 nm or less.

4. The method of claim 1, wherein the emissive layer further comprises an undoped semiconductor layer formed between the substrate and the n-type semiconductor layer, and the remaining portion of the emissive layer is a part of the undoped semiconductor layer.

5. The method of claim 1, wherein the forming of the p-type electrode comprises:
    forming an opening by etching the passivation layer formed on the p-type semiconductor layer of the emissive layer so as to expose a surface of the p-type semiconductor layer; and
    forming the p-type electrode on the surface of the p-type semiconductor layer exposed through the opening.

* * * * *